United States Patent
Kil et al.

(10) Patent No.: US 9,462,689 B2
(45) Date of Patent: *Oct. 4, 2016

(54) EPOXY RESIN COMPOSITION AND PRINTED CIRCUIT BOARD INCLUDING INSULATING LAYER USING THE EPOXY RESIN COMPOSITION

(71) Applicant: LG INNOTEK CO., LTD., Seoul (KR)

(72) Inventors: Geon Young Kil, Seoul (KR); Myeong Jeong Kim, Seoul (KR); Jae Man Park, Seoul (KR); Jong Heum Yoon, Seoul (KR); Jeung Ook Park, Seoul (KR); Sung Jin Yun, Seoul (KR); Jong Sik Lee, Seoul (KR); Sang A. Ju, Seoul (KR); Yeo Eun Yoon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/647,721

(22) PCT Filed: Nov. 22, 2013

(86) PCT No.: PCT/KR2013/010688
§ 371 (c)(1),
(2) Date: May 27, 2015

(87) PCT Pub. No.: WO2014/084555
PCT Pub. Date: Jun. 5, 2014

(65) Prior Publication Data
US 2015/0305152 A1  Oct. 22, 2015

(30) Foreign Application Priority Data

Nov. 30, 2012 (KR) .................. 10-2012-0137965
Nov. 30, 2012 (KR) .................. 10-2012-0137996

(51) Int. Cl.
| | |
|---|---|
| H05K 1/05 | (2006.01) |
| B32B 15/092 | (2006.01) |
| B32B 27/20 | (2006.01) |
| B32B 27/26 | (2006.01) |
| B32B 27/38 | (2006.01) |
| C08L 63/00 | (2006.01) |
| C08K 3/22 | (2006.01) |
| C08K 3/28 | (2006.01) |
| C08K 3/34 | (2006.01) |
| C08K 3/36 | (2006.01) |
| C08K 3/38 | (2006.01) |
| H05K 1/03 | (2006.01) |
| H01B 3/40 | (2006.01) |
| C08G 59/50 | (2006.01) |
| C08G 59/22 | (2006.01) |
| C08G 59/56 | (2006.01) |
| C09K 5/14 | (2006.01) |
| C08K 3/00 | (2006.01) |
| C08K 5/41 | (2006.01) |

(52) U.S. Cl.
CPC .......... *H05K 1/0373* (2013.01); *C08G 59/226* (2013.01); *C08G 59/504* (2013.01); *C08G 59/5033* (2013.01); *C08G 59/56* (2013.01); *C08K 3/22* (2013.01); *C08L 63/00* (2013.01); *C09K 5/14* (2013.01); *H01B 3/40* (2013.01); *H05K 1/056* (2013.01); *C08G 2250/00* (2013.01); *C08K 3/0033* (2013.01); *C08K 5/41* (2013.01); *C08K 2003/2227* (2013.01); *C08L 2203/20* (2013.01); *H05K 2201/0209* (2013.01)

(58) Field of Classification Search
None
See application file for complete search history.

(56) References Cited

U.S. PATENT DOCUMENTS

| | | | |
|---|---|---|---|
| 4,594,291 A | 6/1986 | Bertram et al. | |
| 4,847,348 A | 7/1989 | Fischer et al. | |
| 2007/0232727 A1 | 10/2007 | Lin et al. | |
| 2009/0105388 A1 | 4/2009 | Tanaka et al. | |
| 2010/0016473 A1 | 1/2010 | Kaji et al. | |
| 2010/0016498 A1* | 1/2010 | Kaji ............... | C08G 59/245 524/540 |
| 2011/0163461 A1 | 7/2011 | Nowak et al. | |
| 2012/0202918 A1 | 8/2012 | Singh et al. | |
| 2012/0296010 A1* | 11/2012 | Shimizu ............. | C08L 63/00 523/400 |
| 2014/0015000 A1 | 1/2014 | Nishiyama et al. | |
| 2015/0305152 A1 | 10/2015 | Kil et al. | |
| 2015/0319854 A1* | 11/2015 | Kim ................. | C08K 3/22 174/258 |
| 2015/0319855 A1* | 11/2015 | Yoon ................ | C08G 59/22 174/258 |
| 2015/0319856 A1* | 11/2015 | Yun ................. | C08K 3/38 174/258 |
| 2015/0319857 A1* | 11/2015 | Yoon ................ | C08K 3/28 174/258 |
| 2015/0334827 A1* | 11/2015 | Kim ................. | C08G 59/22 174/258 |

FOREIGN PATENT DOCUMENTS

| | | |
|---|---|---|
| CN | 101198632 A | 6/2008 |
| CN | 101466757 | 6/2009 |
| CN | 101611069 A | 12/2009 |
| CN | 101974208 | 2/2011 |
| CN | 102559113 | 7/2012 |
| CN | 102786773 A | 11/2012 |
| JP | 06-200121 A | 7/1994 |
| JP | 06-216484 A * | 8/1994 ............... H05K 1/05 |

(Continued)

OTHER PUBLICATIONS

Machine translation of JP 06-216484 A (no date).*

(Continued)

*Primary Examiner* — Michael J Feely
(74) *Attorney, Agent, or Firm* — KED & Associates, LLP

(57) ABSTRACT

An epoxy resin composition according to an embodiment of the present invention includes an epoxy compound, a curing agent including diaminodiphenyl sulfone, and an inorganic filler.

13 Claims, 1 Drawing Sheet

(56) References Cited

FOREIGN PATENT DOCUMENTS

| | | | | |
|---|---|---|---|---|
| JP | 06-334288 A | * | 12/1994 | ............ H05K 1/05 |
| JP | 2001-279064 A | | 10/2001 | |
| JP | 2008-277407 A | | 11/2008 | |
| JP | 2011-181648 A | | 9/2011 | |
| JP | 2011-181650 A | | 9/2011 | |
| JP | 2011-181651 A | | 9/2011 | |
| JP | 2011-181652 A | | 9/2011 | |
| JP | 2012092297 | | 5/2012 | |
| KR | 10-2000-0025443 A | | 5/2000 | |
| KR | 10-2004-0039090 A | | 5/2004 | |
| KR | 10-2007-0009604 A | | 1/2007 | |
| KR | 10-2010-0008771 A | | 1/2010 | |
| KR | 10-0937918 B1 | | 1/2010 | |
| KR | 10-0970906 B1 | | 7/2010 | |
| KR | 10-2010-0134313 A | | 12/2010 | |
| KR | 10-2011-0017853 A | | 2/2011 | |
| KR | 10-2011-0027807 A | | 3/2011 | |
| KR | 10-2012-0074109 A | | 7/2012 | |
| KR | 10-2012-0109266 A | | 10/2012 | |
| WO | WO 2009/138301 A1 | | 11/2009 | |
| WO | WO 2009/144955 A1 | | 12/2009 | |
| WO | WO 2012/133587 | | 10/2012 | |
| WO | WO 2013/009114 A2 | * | 1/2013 | ............ C08L 63/00 |
| WO | WO 2013/032238 A2 | * | 3/2013 | ............ C08G 59/20 |

OTHER PUBLICATIONS

Machine translation of JP 06-334288 A (no date).*
International Search Report dated Jan. 27, 2014 issued in Application No. PCT/KR2013/010688.
International Search Report dated Jan. 24, 2014 issued in Application No. PCT/KR2013/011313 (with English translation).
International Search Report dated Jan. 24, 2014 issued in Application No. PCT/KR2013/011314 (with English translation).
International Search Report dated Jan. 24, 2014 issued in Application No. PCT/KR2013/011315 (with English translation).
International Search Report dated Jan. 27, 2014 issued in Application No. PCT/KR2013/011311 (with English translation).
International Search Report dated Jan. 27, 2014 issued in Application No. PCT /KR2013/011312. (with English translation).
U.S. Office action dated Jan. 14, 2016 issued in co-pending U.S. Appl. No. 14/651,768.
U.S. Office action dated Mar. 29, 2016 issued in co-pending U.S. Appl. No. 14/651,771.
U.S. Office action dated Jan. 14, 2016 issued in co-pending U.S. Appl. No. 14/651,842.
U.S. Office action dated Feb. 11, 2016 issued in co-pending U.S. Appl. No. 14/651,783.
U.S. Office action dated Jan. 14, 2016 issued in co-pending U.S. Appl. No. 14/652,031.
Chinese Office Action dated May 24, 2016 issued in Application No. 201380062540.6 (with English Translation).
U.S. Notice of Allowance dated May 9, 2016 issued in U.S. Appl. No. 14/651,768.
U.S. Notice of Allowance dated May 10, 2016 issued in U.S. Appl. No. 14/651,842.
U.S. Notice of Allowance dated May 11, 2016 issued in U.S. Appl. No. 14/652,031.
Chinese Office Action dated Jun. 1, 2016 issued in Application No. 201380065257.9 (with English Translation).
Chinese Office Action dated Jun. 1, 2016 issued in Application No. 201380065310.5 (with English Translation).
Chinese Office Action dated Jun. 1, 2016 issued in Application No. 201380065125.6 (with English Translation).
Chinese Office Action dated Jun. 1, 2016 issued in Application No. 201380070409.4 (with English Translation).
U.S. Notice of Allowance dated Jun. 16, 2016 issued in U.S. Appl. No. 14/651,783.
U.S. Notice of Allowance dated Jul. 13, 2016 issued in U.S. Appl. No. 14/651,771.

* cited by examiner

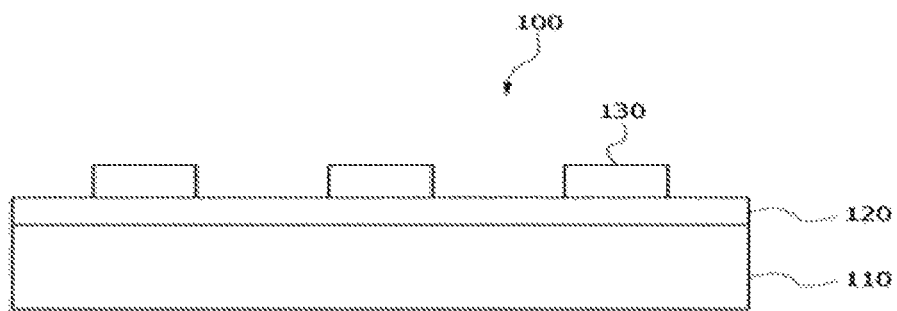

EPOXY RESIN COMPOSITION AND PRINTED CIRCUIT BOARD INCLUDING INSULATING LAYER USING THE EPOXY RESIN COMPOSITION

CROSS-REFERENCE TO RELATED PATENT APPLICATIONS

This application is a U.S. National Stage Application under 35 U.S.C. §371 of PCT Application No. PCT/KR2013/010688, filed Nov. 22, 2013, which claims priority to Korean Patent Application Nos. 10-2012-0137965 and 10-2012-0137996, both filed Nov. 30, 2012, whose entire disclosures are incorporated herein by reference.

BACKGROUND

1. Field of the Invention

The present invention relates to an epoxy resin composition, and more specifically, to an epoxy resin composition used in an insulating layer of a printed circuit board.

2. Discussion of Related Art

A printed circuit board includes a circuit pattern formed on an insulating layer, and a diversity of electronic components may be mounted on the printed circuit board.

An example of the electronic component mounted on the printed circuit board may include a heating element. Heat emitted from the heating element may degrade the performance of the printed circuit board. According to the electronic component being highly concentrated and having a higher capacity, there is an increasing concern about the problem of heat dissipation of the printed circuit board.

An epoxy resin composition including a bisphenol A type epoxy compound or a bisphenol F type epoxy compound has been used for the insulating layer of the printed circuit board. However, the bisphenol A type epoxy compound or the bisphenol F type epoxy compound has low viscosity, causing a problem of insufficient curing properties, mechanical strength, toughness, etc.

Accordingly, an epoxy resin composition including a crystalline epoxy compound having a mesogen structure, a novolac resin and an inorganic filler is used (Korean Patent Laid-Open Publication No. 2012-0068949). Such an epoxy resin composition has excellent storage stability before curing, curing properties, and the like, but is limited in obtaining a desired level of thermal conductivity.

SUMMARY OF THE INVENTION

The technical subject to be achieved by the present invention is directed to providing an epoxy resin composition and a printed circuit board including an insulating layer using the epoxy resin composition.

According to an aspect of the present invention, there is provided an epoxy resin composition which includes an epoxy compound including an epoxy compound of the following chemical formula, a curing agent including diaminodiphenyl sulfone, and an inorganic filler.

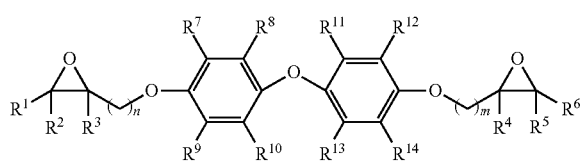

In the chemical formula, $R^1$ to $R^{14}$ each may be selected from the group consisting of H, Cl, Br, F, an alkyl group having 1 to 3 carbon atoms, an alkene group having 2 to 3 carbon atoms, and an alkyne group having 2 to 3 carbon atoms. Here, m and n each may be 1, 2 or 3.

The epoxy compound may be the epoxy compound of the following chemical formula.

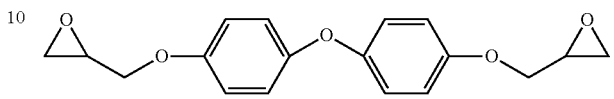

The epoxy compound of the chemical formula may be contained at 3 wt % or more of the epoxy resin composition.

The weight ratio of the epoxy compound of the chemical formula to the diaminodiphenyl sulfone may be in the range of 1 to 0.1 to 1 to 4.

The weight ratio of the epoxy compound of the chemical formula to the diaminodiphenyl sulfone may be in the range of 1 to 0.4 to 1 to 0.8.

The epoxy compound may be included at 3 to 40 wt % of the epoxy resin composition, the curing agent may be included at 0.5 to 30 wt % of the epoxy resin composition, and the inorganic filler may be included at 30 to 96.5 wt % of the epoxy resin composition.

According to another aspect of the present invention, there is provided a printed circuit board which includes a metal plate, an insulating layer formed on the metal plate, and a circuit pattern formed on the insulating layer, wherein the insulating layer includes an epoxy resin composition having an epoxy compound including an epoxy compound of the following chemical formula, a curing agent including diaminodiphenyl sulfone, and an inorganic filler.

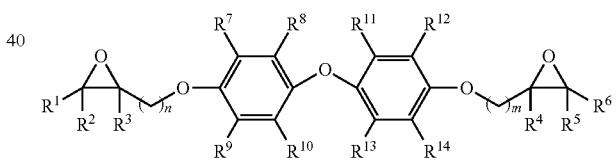

In the chemical formula, $R^1$ to $R^{14}$ each may be selected from the group consisting of H, Cl, Br, F, an alkyl group having 1 to 3 carbon atoms, an alkene group having 2 to 3 carbon atoms, and an alkyne group having 2 to 3 carbon atoms. Here, m and n each may be 1, 2 or 3.

The insulating layer may have a glass transition temperature of 120° C. or more, and thermal conductivity of 10 W/mK or more.

Advantageous Effects

According to the embodiment of the present invention, the epoxy resin composition which includes the epoxy resin with the mesogen structure increasing crystallinity and diaminodiphenyl sulfone can be obtained. When the epoxy resin composition is used, the insulating layer having a high thermal resistance, glass transition temperature and thermal conductivity can be obtained, and the reliability and heat dissipation performance of the printed circuit board can be improved.

BRIEF DESCRIPTION OF THE DRAWINGS

FIG. 1 is a cross-sectional view of a printed circuit board according to an embodiment of the present invention.

DETAILED DESCRIPTION OF EXEMPLARY EMBODIMENTS

As the present invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention.

Although the terms first, second, etc. may be used to describe various elements, these elements are not limited by these terms. These terms are only used to distinguish one element from another. For example, a first element could be termed a second element, and, similarly, a second element could be termed a first element, without departing from the scope of exemplary embodiments. The term "and/or" includes any and all combinations of one or more of the associated listed items.

The terminology used herein is for the purpose of describing particular embodiments only and is not intended to be limiting of exemplary embodiments. The singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components and/or groups thereof, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when an element such as a layer, film, region, or substrate is referred to as being "on" another element, it can be directly on the other element or intervening elements may also be present. It will be understood that when an element such as a layer, film, region, or substrate is referred to as being "on" another element, it can be directly on the other element or intervening elements may also be present.

With reference to the appended drawings, exemplary embodiments of the present invention will be described in detail below. To aid in understanding the present invention, like numbers refer to like elements throughout the description of the FIGUREs, and the description of the same elements will be not reiterated.

According to an aspect of the present invention, there is provided an epoxy resin composition which includes an epoxy resin with a mesogen structure, a curing agent and an inorganic filler. Here, mesogen is the fundamental unit of a liquid crystal, which includes a rigid structure. For example, mesogen may include a rigid structure such as a structure of biphenyl, phenyl benzoate, naphthalene, etc.

The epoxy resin composition according to the embodiment of the present invention may include the epoxy compound at 3 to 40 wt %, preferably 3 to 30 wt %, more preferably 3 to 20 wt % based on the total weight of the epoxy resin composition. When the epoxy compound is contained at 3 wt % or less based on the total weight of the epoxy resin composition, adhesion may decrease. When the epoxy compound is contained at 40 wt % or more based on the total weight of the epoxy resin composition, a thickness may be difficult to be adjusted. Here, the epoxy resin composition may include a crystalline epoxy compound at 3 wt % or more based on the total weight of the epoxy resin composition. When the crystalline epoxy compound is contained at less than 3 wt % based on the total weight of the epoxy resin composition, the epoxy resin composition may not be crystallized, and thus the effect of thermal conductivity may decrease.

Here, the crystalline epoxy compound may be represented by the following Chemical Formula 1.

[Chemical Formula 1]

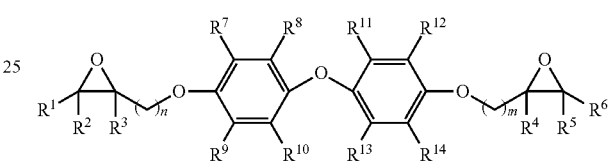

In Chemical Formula 1, $R^1$ to $R^{14}$ each may be selected from the group consisting of H, Cl, Br, F, an alkyl group having 1 to 3 carbon atoms, an alkene group having 2 to 3 carbon atoms, and an alkyne group having 2 to 3 carbon atoms. Here, m and n each may be 1, 2 or 3.

The crystalline epoxy compound may also be represented by the following Chemical Formula 2.

[Chemical Formula 2]

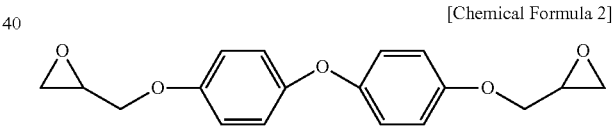

Chemical Formula 2 may be referred to as 4,4'-biphenolether diglycidyl ether. Regarding the physical properties of the epoxy compound according to Chemical Formula 2, a melting point is 158° C., and a result of a $^1$H NMR measurement (CDCL3-d6, ppm) is as below: δ=8.58 (s, $^2$H), δ=8.17-8.19 (d, $^4$H), δ=7.99-8.01 (d, $^4$H), δ=7.33 (s, $^4$H), δ=4.69-4.72 (d, $^1$H), δ=4.18-4.22 (m, $^1$H), δ=3.36-3.40 (m, $^1$H), δ=2.92-2.94 (m, $^1$H) and δ=2.74-2.77 (m, $^1$H). The melting point was measured at a heating rate of 10° C./min using a differential scanning calorimetry device (DSC Q100; manufactured by TA Instruments). The NMR measurement was performed using H-NMR after dissolving the epoxy compound in CDCL3-d6.

In addition to the crystalline epoxy compound according to Chemical Formula 1 or Chemical Formula 2, the epoxy resin composition may further include another typical non-crystalline epoxy compound having two or more epoxy groups in its molecule. When the non-crystalline epoxy compound is further included besides the crystalline epoxy compound, room temperature stability may increase.

For example, the non-crystalline epoxy compound may be one of glycidyl etherified compounds derived from divalent phenols such as bisphenol A, bisphenol F, 3,3',5,5'-tetramethyl-4,4'-dihydroxydiphenyl methane, 4,4'-dihydroxydiphenyl sulfone, 4,4'-dihydroxydiphenyl sulfide, 4,4'-dihydroxydiphenyl ketone, fluorene bisphenol, 4,4'-biphenol, 3,3',5,5'-tetramethyl-4,4'-dihydroxybiphenyl, 2,2-biphenol, resorcinol, catechol, t-butylcatechol, hydroquinone, t-butylhydroquinone, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxy naphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxy naphthalene, allylated or polyallylated compounds of the above-described dihydroxynaphthalenes, allylated bisphenol A, allylated bisphenol F, allylated phenol novolac, or the like; trivalent or more phenols such as phenol novolac, bisphenol A novolac, o-cresol novolac, m-cresol novolac, p-cresol novolac, xylenol novolac, poly-p-hydroxystyrene, tris-(4-hydroxyphenyl) methane, 1,1,2,2-tetrakis (4-hydroxyphenyl)ethane, phloroglucinol, pyrogallol, t-butylpyrogallol, allylated pyrogallol, polyallylated pyrogallol, 1,2,4-benzenetriol, 2,3,4-trihydroxybenzophenone, a phenol aralkyl resin, a naphthol aralkyl resin, a dicyclopentadiene-based resin, or the like; halogenated bisphenols such tetrabromobisphenol A or the like, and mixtures thereof.

An example of the bisphenol A type epoxy compound includes a compound of Chemical Formula 3.

[Chemical Formula 5]

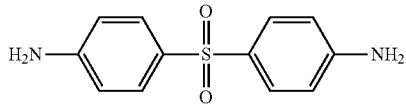

Here, the weight ratio of the epoxy compound of Chemical Formula 2 to the 4,4'-diaminodiphenyl sulfone may be 1 to 0.1 to 4, preferably 1 to 0.2 to 2, more preferably 1 to 0.3 to 1.5, and most preferably 1 to 0.4 to 0.8. When the weight ratio of the epoxy compound of Chemical Formula 2 to the 4,4'-diaminodiphenyl sulfone is 1 to 0.1 to 1 to 4, the epoxy resin composition may have excellent adhesion, a high glass transition temperature and thermal conductivity, and the thickness of the epoxy resin composition may be easily adjusted. When the weight ratio of the epoxy compound of Chemical Formula 2 to the 4,4'-diaminodiphenyl sulfone is 1 to 0.4 to 0.8, the epoxy resin composition may have an optimum glass transition temperature (e.g., 120° C. or more) and thermal conductivity (e.g., 10 W/mK or more).

At least one selected from the group consisting of a phenolic curing agent, an amine-based curing agent, and an acid anhydride-based curing agent may be further included in the epoxy resin composition.

For example, the phenolic curing agent may be one selected from the group consisting of bisphenol A, bisphenol

[Chemical Formula 3]

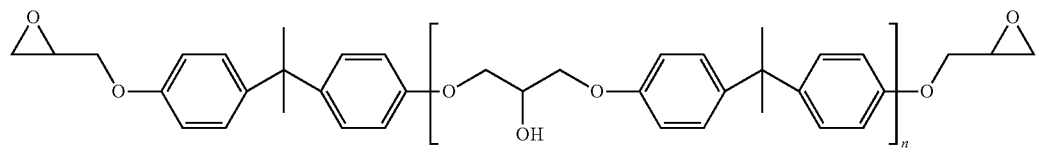

Here, n is an integer of 1 or more.

An example of the bisphenol F type epoxy compound includes a compound of Chemical Formula 4.

[Chemical Formula 4]

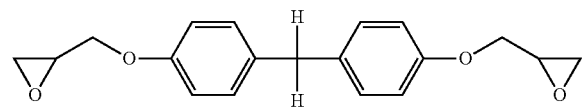

The epoxy resin composition according to the embodiment of the present invention may include the curing agent at 0.5 to 30 wt % based on the total weight of the epoxy resin composition. When the curing agent is contained at 0.5 wt % or less based on the total weight of the epoxy resin composition, adhesion may decrease. When the curing agent is contained at 30 wt % or more based on the total weight of the epoxy resin composition, a thickness may be difficult to be adjusted. The curing agent included in the epoxy resin composition may be 4,4'-diaminodiphenyl sulfone of the following Chemical Formula 5.

F, 4,4'-dihydroxydiphenyl methane, 4,4'-dihydroxydiphenyl ether, 1,4-bis(4-hydroxyphenoxy)benzene, 1,3-bis(4-hydroxyphenoxy)benzene, 4,4'-dihydroxydiphenyl sulfide, 4,4'-dihydroxydiphenyl ketone, 4,4'-dihydroxydiphenyl sulfone, 4,4'-hydroxybiphenyl, 2,2'-hydroxybiphenyl, 10-(2,5-dihydroxyphenyl)-10H-9-oxa-10-phosphaphenanthrene-10-oxide, phenol novolac, bisphenol A novolac, o-cresol novolac, m-cresol novolac, p-cresol novolac, xylenol novolac, poly-p-hydroxystyrene, hydroquinone, resorcinol, catechol, t-butylcatechol, t-butylhydroquinone, phloroglucinol, pyrogallol, t-butylpyrogallol, allylated pyrogallol, polyallylated pyrogallol, 1,2,4-benzenetriol, 2,3,4-trihydroxybenzophenone, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxynaphthalene, allylated or polyallylated compounds of the above-described dihydroxynaphthalenes, allylated bisphenol A, allylated bisphenol F, allylated phenol novolac, allylated pyrogallol, and mixtures thereof.

For example, the amine-based curing agent may be aliphatic amines, polyether polyamines, alicyclic amines, aromatic amines, or the like, and examples of the aliphatic amines include ethylenediamine, 1,3-diaminopropane, 1,4-diaminopropane, hexamethylenediamine, 2,5-dimethylhexamethylenediamine, trimethylhexamethylenediamine, diethylenetriamine, iminobis propylamine, bis(hexamethylene) triamine, triethylenetetramine, tetraethylenepentamine, pentaethylenehexamine, N-hydroxyethyl ethylenediamine, tetra(hydroxyethyl) ethylenediamine, etc. The polyether polyamines may be one selected from the group consisting of triethylene glycol diamine, and tetraethylene glycol diamine, diethylene glycol bis(propylamine), polyoxypropylene diamine, polyoxypropylene triamines and mixtures thereof. Examples of the alicyclic amines include isophorone diamine, methacene diamine, N-aminoethylpiperazine, bis(4-amino-3-methyldicyclohexyl)methane, bis (aminomethyl)cyclohexane, 3,9-bis(3-aminopropyl)2,4,8, 10-tetra-oxaspiro(5,5)undecane, norbornene diamine, etc. The aromatic amines may be one selected from the group consisting of tetrachloro-p-xylene diamine, m-xylene diamine, p-xylene diamine, m-phenylenediamine, o-phenylenediamine, p-phenylenediamine, 2,4-diamino-anisole, 2,4-toluenediamine, 2,4-diaminodiphenylmethane, 4,4'-diaminodiphenylmethane, 4,4'-diamino-1,2-diphenylethane, 2,4-diaminodiphenylsulfone, m-aminophenol, m-aminobenzylamine, benzyldimethylamine, 2-dimethylaminomethyl phenol, triethanolamine, methylbenzylamine, α-(m-aminophenyl)ethylamine, α-(p-aminophenyl)ethylamine, diaminodiethyldimethyldiphenylmethane, α,α'-bis(4-aminophenyl)-p-diisopropylbenzene, and mixtures thereof.

For example, the acid anhydride-based curing agent may be one selected from the group consisting of dodecenyl succinic anhydride, poly adipic anhydride, poly azelaic anhydride, poly sebacic anhydride, poly(ethyl octadecanoic diacid) anhydride, poly(phenylhexadecane diacid) anhydride, methyltetrahydrophthalic anhydride, methylhexahydrophthalic anhydride, hexahydrophthalic anhydride, methyl himic anhydride, tetrahydrophthalic anhydride, trialkyl tetrahydrophthalic anhydride, methylcyclohexene dicarboxylic anhydride, methylcyclohexene tetracarboxylic anhydride, phthalic anhydride, trimellitic anhydride, pyromellitic anhydride, benzophenone tetracarboxylic anhydride, ethylene glycol bis trimellitate, chlorendic anhydride, nadic anhydride, methyl nadic anhydride, 5-(2,5-dioxotetrahydro-3-furanyl)-3-methyl-3-cyclohexane-1,2-dicarboxylic anhydride, 3,4-dicarboxy-1,2,3,4-tetrahydro-1-naphthalene succinic dianhydride, 1-methyl-dicarboxy-1,2,3,4-tetrahydro-1-naphthalene succinic dianhydride and mixtures thereof.

The epoxy resin composition may further include a curing accelerator.

The epoxy resin composition according to the embodiment of the present invention may include an inorganic filler at 30 to 96.5 wt % based on the total weight of the epoxy resin composition. When the inorganic filler is included at less than 30 wt %, the high thermal conductivity, low thermal expansion and high thermal resistance of the epoxy resin composition may not be ensured. The more the inorganic filler is added, the more excellent the high thermal conductivity, low thermal expansion and high thermal resistance are. The high thermal conductivity, low thermal expansion and high thermal resistance are not improved according to the volume fraction of the inorganic filler, but start to be significantly improved when the inorganic filler is added at a specific amount. However, when the inorganic filler is included at more than 96.5 wt %, viscosity increases, and thus formability is deteriorated.

For example, the inorganic filler may be one selected from the group consisting of alumina, aluminum nitride, silicon nitride, boron nitride, crystalline silica, and mixtures thereof. The average diameter of the inorganic filler may be, for example, 30 μm or less. This is because, when the average diameter of the inorganic filler is more than 30 μm, liquidity of the epoxy resin composition may be negatively affected, and strength may decrease.

The epoxy resin composition according to the embodiment of the present invention may be applied to a printed circuit board. FIG. 1 is a cross-sectional view of a printed circuit board according to the embodiment of the present invention.

Referring to FIG. 1, the printed circuit board 100 includes a metal plate 110, an insulating layer 120 and a circuit pattern 130.

The metal plate 110 may be formed of copper, aluminum, nickel, gold, platinum, and alloys thereof.

The insulating layer 120 including the epoxy resin composition according to the embodiment of the present invention is formed on the metal plate 110.

The circuit pattern 130 is formed on the insulating layer 120.

When the epoxy resin composition according to the embodiment of the present invention is used as the insulating layer, the printed circuit board having excellent heat dissipation performance may be obtained.

Hereinafter, the present invention will be described in detail in conjunction with examples and comparative examples.

Example 1

A mixed solution of 10 wt % of the crystalline epoxy compound of Chemical Formula 2, 10 wt % of a bisphenol F type epoxy compound, 6 wt % of 4,4'-diaminodiphenyl sulfone, 1 wt % of phenoxy and 73 wt % of alumina was dried, was heat-treated at 80° C. for 30 minutes, and then was cured at 210° C. for 2 hours to obtain an epoxy resin composition of Example 1.

Example 2

A mixed solution of 10 wt % of the crystalline epoxy compound of Chemical Formula 2, 10 wt % of a bisphenol F type epoxy compound, 3 wt % of phenol novolac, 3 wt % of 4,4'-diaminodiphenyl sulfone, 0.5 wt % of a phenoxy resin and 73.5 wt % of alumina was dried, was heat-treated at 80° C. for 30 minutes, and then was cured at 210° C. for 2 hours to obtain an epoxy resin composition of Example 2.

Example 3

A mixed solution of 10 wt % of the crystalline epoxy compound of Chemical Formula 2, 10 wt % of a bisphenol F type epoxy compound, 2 wt % of 4,4'-dihydroxy diphenyl ester, 6 wt % of 4,4'-diaminodiphenyl sulfone, 1 wt % of BYK-21211-methoxy-2-propanol acetate and 71 wt % of alumina was dried, was heat-treated at 80° C. for 30 minutes, and then was cured at 210° C. for 2 hours to obtain an epoxy resin composition of Example 3.

Example 4

A mixed solution of 3 wt % of the crystalline epoxy compound of Chemical Formula 2, 13 wt % of a bisphenol A type epoxy compound, 4 wt % of a bisphenol F type epoxy compound, 2 wt % of 4,4'-dihydroxy diphenyl ester, 13 wt % of 4,4'-diaminodiphenyl sulfone, 0.8 wt % of BYK-21211-methoxy-2-propanol acetate and 63.2 wt % of alumina was dried, was heat-treated at 80° C. for 30 minutes, and then was cured at 210° C. for 2 hours to obtain an epoxy resin composition of Example 4.

Example 5

A mixed solution of 4 wt % of the crystalline epoxy compound of Chemical Formula 2, 12 wt % of a bisphenol A type epoxy compound, 4 wt % of a bisphenol F type epoxy compound, 2 wt % of 4,4'-dihydroxy diphenyl ester, 11 wt % of 4,4'-diaminodiphenyl sulfone, 1 wt % of BYK-21211-methoxy-2-propanol acetate and 67 wt % of alumina was dried, was heat-treated at 80° C. for 30 minutes, and then was cured at 210° C. for 2 hours to obtain an epoxy resin composition of Example 5.

Comparative Example 1

A mixed solution of 10 wt % of the crystalline epoxy compound of Chemical Formula 2, 10 wt % of a bisphenol A type epoxy compound, 6 wt % of phenol novolac, 0.8 wt % of a phenoxy resin and 73.2 wt % of alumina was dried, was heat-treated at 80° C. for 30 minutes, and then was cured at 210° C. for 2 hours to obtain an epoxy resin composition of Comparative Example 1.

Comparative Example 2

A mixed solution of 10 wt % of the crystalline epoxy compound of Chemical Formula 2, 10 wt % of a bisphenol F type epoxy compound, 6 wt % of 4,4'-diaminodiphenylmethane, 1 wt % of a phenoxy resin and 73 wt % of alumina was dried, was heat-treated at 80° C. for 30 minutes, and then was cured at 210° C. for 2 hours to obtain an epoxy resin composition of Comparative Example 2.

Comparative Example 3

A mixed solution of 2 wt % of the crystalline epoxy compound of Chemical Formula 2, 14 wt % of a bisphenol A type epoxy compound, 4 wt % of a bisphenol F type epoxy compound, 6 wt % of phenol novolac, 1 wt % of a phenoxy resin and 73 wt % of alumina was dried, was heat-treated at 80° C. for 30 minutes, and then was cured at 210° C. for 2 hours to obtain an epoxy resin composition of Comparative Example 3.

Comparative Example 4

A mixed solution of 18 wt % of a bisphenol A type epoxy compound, 2 wt % of a bisphenol F type epoxy compound, 8 wt % of 4,4'-diaminodiphenylmethane, 0.7 wt % of a phenoxy resin and 71.3 wt % of alumina was dried, was heat-treated at 80° C. for 30 minutes, and then was cured at 210° C. for 2 hours to obtain an epoxy resin composition of Comparative Example 4.

Comparative Example 5

A mixed solution of 14 wt % of a bisphenol A type epoxy compound, 6 wt % of a bisphenol F type epoxy compound, 9 wt % of 4,4'-diaminodiphenylmethane, 0.6 wt % of a phenoxy resin and 70.4 wt % of alumina was dried, was heat-treated at 80° C. for 30 minutes, and then was cured at 210° C. for 2 hours to obtain an epoxy resin composition of Comparative Example 5.

Comparative Example 6

A mixed solution of 13 wt % of a bisphenol A type epoxy compound, 7 wt % of a bisphenol F type epoxy compound, 6 wt % of 4,4'-diaminodiphenylmethane, 0.4 wt % of a phenoxy resin and 73.6 wt % of alumina was dried, was heat-treated at 80° C. for 30 minutes, and then was cured at 210° C. for 2 hours to obtain an epoxy resin composition of Comparative Example 6.

Comparative Example 7

A mixed solution of 18 wt % of a bisphenol A type epoxy compound, 2 wt % of a bisphenol F type epoxy compound, 8 wt % of 4,4'-dihydroxydiphenyl ester, 0.7 wt % of BYK-21211-methoxy-2-propanol acetate and 70.3 wt % of alumina was dried, was heat-treated at 80° C. for 30 minutes, and then was cured at 210° C. for 2 hours to obtain an epoxy resin composition of Comparative Example 7.

Comparative Example 8

A mixed solution of 14 wt % of a bisphenol A type epoxy compound, 6 wt % of a bisphenol F type epoxy compound, 9 wt % of 4,4'-dihydroxydiphenyl ester, 0.6 wt % of BYK-21211-methoxy-2-propanol acetate and 72.4 wt % of alumina was dried, was heat-treated at 80° C. for 30 minutes, and then was cured at 210° C. for 2 hours to obtain an epoxy resin composition of Comparative Example 8.

Comparative Example 9

A mixed solution of 13 wt % of a bisphenol A type epoxy compound, 7 wt % of a bisphenol F type epoxy compound, 6 wt % of 4,4'-dihydroxydiphenyl ester, 0.4 wt % of BYK-21211-methoxy-2-propanol acetate and 75.6 wt % of alumina was dried, was heat-treated at 80° C. for 30 minutes, and then was cured at 210° C. for 2 hours to obtain an epoxy resin composition of Comparative Example 9.

The glass transition temperature of each epoxy resin composition of Examples 1 to 2, and Comparative Examples 1 to 2 was measured at a heating rate of 10° C./min using the DSC Q100 calorimeter manufactured by TA Instruments, and the thermal conductivity of each epoxy resin composition of Examples 1 to 5, and Comparative Examples 1 to 9 was measured through a transient hot wire method using a thermal conductivity measurement instrument (LFA447; manufactured by Netzsch-Gerätebau GmbH.) The result was shown in Tables 1 to 2.

TABLE 1

| Experiment No. | Thermal conductivity (W/m · K) | Glass transition temperature (° C.) |
| --- | --- | --- |
| Example 1 | 10.5 | 145 |
| Example 2 | 9.34 | 99 |
| Comparative Example 1 | 8.02 | 115 |
| Comparative Example 2 | 10.05 | 75 |

As shown in Table 1, it may be determined that the epoxy resin compositions of Examples 1 to 2, which include the crystalline epoxy compound of Chemical Formula 2 and 4,4'-diaminodiphenyl sulfone, have a glass transition temperature of 99° C. or more and a thermal conductivity of 9.34 W/mK or more. Particularly, when the crystalline epoxy compound of Chemical Formula 2 is included at 10 wt % or more, and 4,4'-diaminodiphenyl sulfone is included at 6 wt % or more (the weight ratio of the crystalline epoxy compound of Chemical Formula 2 to 4,4'-diaminodiphenyl sulfone is 1 to 0.6) as in Example 1, it may be determined that the epoxy resin composition has a glass transition temperature of 120° C. or more and a thermal conductivity of 10 W/mK or more.

On the other hand, it may be determined that the epoxy resin compositions of Comparative Examples 1 to 2, which include the crystalline epoxy compound of Chemical Formula 2, but no 4,4'-diaminodiphenyl sulfone, may have an insufficient glass transition temperature (Comparative Example 2, 75° C.), or an insufficient thermal conductivity (Comparative Example 1, 8.02 W/mK).

TABLE 2

| Experiment No. | Thermal conductivity (W/m · K) |
| --- | --- |
| Example 3 | 10.5 |
| Example 4 | 7.89 |
| Example 5 | 8.35 |
| Comparative Example 3 | 6.12 |
| Comparative Example 4 | 2.61 |
| Comparative Example 5 | 3.72 |
| Comparative Example 6 | 5.01 |
| Comparative Example 7 | 2.53 |
| Comparative Example 8 | 3.65 |
| Comparative Example 9 | 4.98 |

Further, the epoxy resin composition according to the embodiment of the present invention may include the crystalline epoxy compound of Chemical Formula 2 and 4,4'-diaminodiphenyl sulfone, and the crystalline epoxy compound of Chemical Formula 2 may be included at 3 wt % based on the total weight of the epoxy resin composition. As shown in Table 2, it may be determined that, when the crystalline epoxy compound of Chemical Formula 2 is included at 3 wt % or more, the epoxy resin composition has a higher thermal conductivity than that of the epoxy resin composition which contains the crystalline epoxy compound of Chemical Formula 2 at 2 wt % (Comparative Example 3) or the epoxy resin composition which contains no crystalline epoxy compound of Chemical Formula 2 (Comparative Examples 4 to 9).

While the spirit of the invention has been described in detail with reference to particular embodiments, it is to be appreciated that those skilled in the art can change or modify the embodiments without departing from the scope and spirit of the invention as set forth in the claims below.

What is claimed is:

1. An epoxy resin composition, comprising:
an epoxy compound including an epoxy compound of the following Chemical Formula 1;
a curing agent including diaminodiphenyl sulfone; and
an inorganic filler:

[Chemical Formula 1]

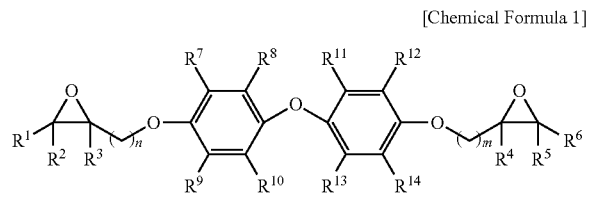

wherein each of $R^1$ to $R^{14}$ is selected from the group consisting of H, Cl, Br, F, an alkyl group having 1 to 3 carbon atoms, an alkene group having 2 to 3 carbon atoms, and an alkyne group having 2 to 3 carbon atoms, and each of m and n is 2 or 3.

2. The epoxy resin composition of claim 1, wherein a weight ratio of the epoxy compound of Chemical Formula 1 to the diaminodiphenyl sulfone is in a range of 1:0.1-4.

3. The epoxy resin composition of claim 2, wherein a weight ratio of the epoxy compound of Chemical Formula 1 to the diaminodiphenyl sulfone is in a range of 1:0.4-0.8.

4. The epoxy resin composition of claim 1, wherein the epoxy compound is included at 3 to 40 wt % of the epoxy resin composition, the curing agent is included at 0.5 to 30 wt % of the epoxy resin composition, and the inorganic filler is included at 30 to 96.5 wt % of the epoxy resin composition.

5. The epoxy resin composition of claim 1, wherein each of m and n is 3.

6. The epoxy resin composition of claim 1, further comprising at least one of bisphenol A type epoxy compound and bisphenol F type epoxy compound.

7. The epoxy resin composition of claim 1, wherein the inorganic filler is selected from the group consisting of alumina, aluminum nitride, silicon nitride, boron nitride, crystalline silica, and mixtures thereof.

8. The epoxy resin composition of claim 1, wherein an average diameter of the inorganic filler is 30 μm or less.

9. The epoxy resin composition of claim 1, wherein the epoxy compound of Chemical Formula 1 is contained at 3 wt % or more of the epoxy resin composition.

10. The epoxy resin composition of claim 1, wherein the epoxy compound of Chemical Formula 1 is contained at 10 wt % or more of the epoxy resin composition and the diaminodiphenyl sulfone is contained at 6 wt % or more of the epoxy resin composition.

11. A printed circuit board, comprising:
a metal plate;
an insulating layer formed on the metal plate; and
a circuit pattern formed on the insulating layer,
wherein the insulating layer includes an epoxy resin composition having an epoxy compound including an epoxy compound of the following Chemical Formula 1, a curing agent including diaminodiphenyl sulfone, and an inorganic filler:

[Chemical Formula 1]

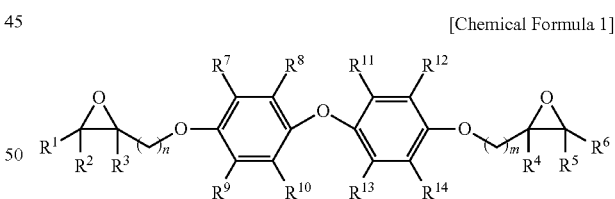

wherein each of $R^1$ to $R^{14}$ is selected from the group consisting of H, Cl, Br, F, an alkyl group having 1 to 3 carbon atoms, an alkene group having 2 to 3 carbon atoms, and an alkyne group having 2 to 3 carbon atoms, where each of m and n is 2 or 3.

12. The printed circuit board of claim 11, wherein the insulating layer has a glass transition temperature of 120° C. or more, and thermal conductivity of 10 W/mK or more.

13. The printed circuit board of claim 11, wherein each of m and n is 3.

* * * * *